(12) United States Patent
Yu

(10) Patent No.: US 10,855,904 B2
(45) Date of Patent: Dec. 1, 2020

(54) FOCUSING METHOD AND APPARATUS, IMAGE PHOTOGRAPHING METHOD AND APPARATUS, AND PHOTOGRAPHING SYSTEM

(71) Applicant: SZ DJI TECHNOLOGY CO., LTD., Shenzhen (CN)

(72) Inventor: Lifu Yu, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/363,113

(22) Filed: Mar. 25, 2019

(65) Prior Publication Data

US 2019/0222746 A1    Jul. 18, 2019

Related U.S. Application Data

(63) Continuation of application No. PCT/CN2016/100075, filed on Sep. 26, 2016.

(51) Int. Cl.
*H04N 5/232* (2006.01)
*H01L 27/146* (2006.01)
*H04N 5/341* (2011.01)

(52) U.S. Cl.
CPC ... *H04N 5/23212* (2013.01); *H01L 27/14605* (2013.01); *H04N 5/23296* (2013.01); *H04N 5/232123* (2018.08); *H04N 5/232127* (2018.08); *H04N 5/341* (2013.01)

(58) Field of Classification Search
CPC ................................................ H04N 5/23296
See application file for complete search history.

(56) References Cited

U.S. PATENT DOCUMENTS

| 9,402,022 | B2 | 7/2016 | Motoda | |
|---|---|---|---|---|
| 2013/0250157 | A1* | 9/2013 | Yoshida | H04N 5/23212 348/333.01 |
| 2015/0365584 | A1* | 12/2015 | Samurov | G03B 13/36 348/349 |
| 2016/0124207 | A1 | 5/2016 | Aizaki | |

FOREIGN PATENT DOCUMENTS

| CN | 103327236 A | 9/2013 |
|---|---|---|
| CN | 103581534 A | 2/2014 |
| CN | 103799962 A | 5/2014 |
| CN | 104519275 A | 4/2015 |
| CN | 105308947 A | 2/2016 |
| JP | 2009038589 A | 2/2009 |
| JP | 2012058447 A | 3/2012 |
| JP | 2013201527 A | 10/2013 |
| JP | 2015154318 A | 8/2015 |
| JP | 2015215371 A | 12/2015 |

OTHER PUBLICATIONS

World Intellectual Property Organization (WIPO) International Search Report for PCT/CN2016/100075 dated Jun. 28, 2017 6 Pages.
Yuki Sakai, Section 2. Basic Transform Processing, OpenGL + GLSL Image Processing Programming, pp. 52-55, Nov. 20, 2009, Engineering Co., Ltd., Japan. (Translation Included).

* cited by examiner

*Primary Examiner* — Christopher K Peterson
(74) *Attorney, Agent, or Firm* — Anova Law Group, PLLC

(57) ABSTRACT

A focusing method includes obtaining a first image, determining a focusing area from the first image, performing a digital zoom process on the focusing area according to a zoom-in ratio to obtain a second image, and performing a focus process on the second image.

20 Claims, 9 Drawing Sheets

400

Capture a first image and determine a focusing area in the first image, the focusing area includes at least one pixel  S410

Perform a first digital zoom process on the focusing area to obtain a second image, according to a preset zoom-in ratio, the second image includes an enlarged focusing area, and an SNR of the second image is greater than the SNR of the focusing area  S420

Perform a focus process on the second image  S430

FIG. 4

| (i-1, j-1) | (i, j-1) | (i+1, j-1) | (i+2, j-1) |
| --- | --- | --- | --- |
| (i-1, j) | (i, j) | (i+1, j) | (i+2, j) |
| (i-1, j+1) | (i, j+1) | (i+1, j+1) | (i+2, j+1) |
| (i-1, j+2) | (i, j+2) | (i+1, j+2) | (i+2, j+2) |

Capture a first image using a first digital zoom factor and a first focus distance, display the first image, and determine a focusing area in the first image, the focusing area includes at least one pixel and the focusing area includes some pixels of the first image — S510

Perform a first digital zoom process on the focusing area using a preset zoom-in ratio to obtain a second image, and display the second image. The second image includes an enlarged focusing area, and an SNR of the second image is greater than the SNR of the focusing area, the digital zoom factor obtained after the first digital zoom process is a second digital zoom factor — S520

Perform a focus process to determine a second focus distance using the second image — S530

Perform a second digital zoom process according to a preset zoom-out ratio, such that a currently used digital zoom factor is changed from the second digital zoom factor to the first digital zoom factor, and the preset zoom-out ratio corresponds to the preset zoom-in ratio — S540

Capture a third image using the first digital zoom factor and the second focus distance, and display the third image — S550

FIG. 6

FOCUSING METHOD AND APPARATUS, IMAGE PHOTOGRAPHING METHOD AND APPARATUS, AND PHOTOGRAPHING SYSTEM

CROSS-REFERENCE TO RELATED APPLICATION

This application is a continuation of International Application No. PCT/CN2016/100075, filed on Sep. 26, 2016, the entire contents of which are incorporated herein by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present disclosure relates to image processing and, more particularly, to a focusing method and apparatus, an image photographing method and apparatus, and a photographing system.

BACKGROUND

Currently, photographing devices generally have an auto-focus (AF) function. The contrast focus methods for realizing the AF function have been widely used.

The contrast focus method realizes the AF by detecting a contour edge of a focus target in a focusing area (e.g., a scene in an image area corresponding to the focusing area) in the image. A sharper contour edge of the focus target corresponds to a greater luminance gradient or a greater contrast between the focus target and background at the edge. According to the above-described principle, a series of image frames are collected while a focus motor is moving in a process of focusing, and contrast values of the image frames are calculated, such that a position of the focus motor corresponding to the image frame with the largest contrast value is found.

The focusing area is a part of the image in a point-focus process. The focusing area is small and only includes a few pixels. Therefore, the signal-to-noise ratio (SNR) in the focusing area is relatively low and the noise interference is relatively large, such that a slow focus speed and a low focus accuracy are caused.

SUMMARY

In accordance with the disclosure, there is provided a focusing method including obtaining a first image, determining a focusing area from the first image, performing a digital zoom process on the focusing area according to a zoom-in ratio to obtain a second image, and performing a focus process on the second image.

Also in accordance with the disclosure, there is provided a focusing apparatus including a processor and a storage medium storing a computer program that, when executed by the processor, causes the processor to obtain a first image, determine a focusing area from the first image, perform a digital zoom process on the focusing area according to a zoom-in ratio to obtain a second image, and perform a focus process on the second image.

BRIEF DESCRIPTION OF THE DRAWINGS

In order to provide a clearer illustration of technical solutions of disclosed embodiments, the drawings used in the description of the disclosed embodiments are briefly described below. It is apparent that the following drawings are merely some embodiments of the present disclosure. Other drawings may be obtained based on the disclosed drawings by those skilled in the art without creative efforts.

FIG. 4 is a schematic flow chart of a focus method according to an example embodiment.

FIG. 5 schematically shows positions of $\alpha$ pixel #1 to $\alpha$ pixel #N according to an example embodiment.

FIG. 6 is a schematic flow chart of an image photographing method according to an example embodiment.

DETAILED DESCRIPTION OF THE EMBODIMENTS

Technical solutions of the present disclosure will be described with reference to the drawings. It will be appreciated that the described embodiments are some rather than all of the embodiments of the present disclosure. Other embodiments conceived by those having ordinary skills in the art on the basis of the described embodiments without inventive efforts should fall within the scope of the present disclosure.

Hereinafter, a structure of a photographing system 100 configured to implement a focus method consistent with the disclosure will be described in detail.

Figure 1:
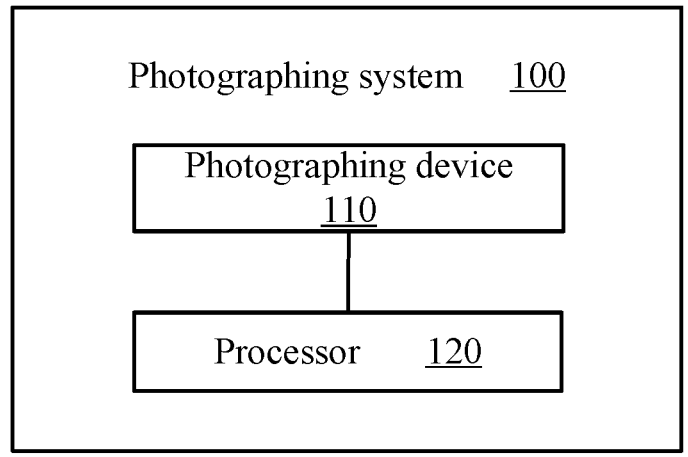
FIG. 1 is a schematic structural diagram of a photographing system according to an example embodiment.

FIG. 1 is a schematic structural diagram of the photographing system 100 consistent with the disclosure. As shown in FIG. 1, the photographing system 100 includes a photographing device 110 and a processor 120.

The photographing device 110 is configured to capture images. A focus distance of the photographing device 110 can be adjusted. In some embodiments, the photographing device 110 can be various kinds of photographing devices that can capture images, for example, a camera.

In some embodiments, the photographing device 110 can be configured to have an auto-focus mechanism. The auto-focus mechanism can be communicatively connected to the processor 120, receive a control command from the processor 120, and adjust the focus distance of the photographing device 110 according to the control command.

In some embodiments, the auto-focus mechanism can be realized by locking the camera into a voice coil motor (VCM). The VCM can include a coil, a magnet group, and two elastic plates, and the coil is fixed in the magnet group by the two elastic plates above and below the coil. When the coil is energized, the coil can generate a magnetic field. The magnetic field of the coil can interact with the magnet group, which can control the coil to move upward and control the camera locked in the coil to move along with the coil. When the coil is de-energized, the coil can return to an original position (i.e., a position of the coil before energized) under an elastic force of the two elastic plates, as such the auto-focus function can be realized. In this situation, the control command from the processor 120 can be configured to control the energization of the coil described above.

In some embodiments, the photographing device 110 can include a charge-coupled device (CCD). The CCD can also be referred to as a CCD image sensor or a CCD image controller. The CCD is a semiconductor device that can convert optical images into electrical signals. A tiny photo-sensitive substance, for example, a photodiode, implanted on the CCD is referred to as a pixel. The CCD having more pixels can provide a higher image resolution. The CCD acts like a film but can convert photons into charges. The CCD has a plurality of neatly arranged photodiodes that can sense light and convert the optical signals into electrical signals. The electrical signals can be converted into a digital image signal through an external sampling device, an amplification device, and an analog-to-digital (AD) conversion device.

In some embodiments, the photographing device 110 can include a complementary metal oxide semiconductor (CMOS). The CMOS is a basic component that is widely used in the manufacture of integrated device chips, and CMOS manufacturing processes have also been applied to the production of photosensitive components of digital imaging devices. The photoelectric conversion principles of the CCD image sensor and the CMOS image sensor are the same. The main difference between the CCD and the CMOS is that a signal readout process is different. Because the CCD has only one (or a few) output nodes to uniformly read out and amplify signals of pixels, a consistency of the signal outputs of different pixels are very good. Each pixel of the CMOS has its own signal amplifier and each signal amplifier performs the charge-voltage conversion separately, such that the consistency of the signal outputs of different pixels are poor. However, the CCD requires a wide signal bandwidth of an output amplifier to read out the entire image signal, but the bandwidth requirement of the amplifier in each pixel of the CMOS is relative low, which greatly reduces the power consumption of the chip. As such, the power consumption of the CMOS is lower than the power consumption of the CCD. Despite reduced power consumption, the inconsistency of millions of amplifiers leads to higher inherent noise, which in turn is an inherent disadvantage of the CMOS relative to the CCD.

The above-described examples of the photographing device 110 are merely for illustration. In the present disclosure, the photographing device 110 is not limited. Any photographing device that can adjust the focus distance should fall within the protection scope of the present disclosure.

The processor 120 is communicatively connected to the photographing device 110 to obtain an image captured by the photographing device 110 and generate the control command based on the image. The control command is configured to control a focus process of the photographing device 110 (e.g., control the auto-focus mechanism in the photographing device 110).

In some embodiments, the processor can be a central processing unit (CPU) or another general-purpose processor, a digital signal processor (DSP), an application-specific integrated device (ASIC), a field programmable gate array (FPGA), or another programmable logic device, a discrete gate, a transistor logic device, a discrete hardware component, or the like. The general-purpose processor can be a microprocessor, any conventional processor, or the like. The FPGA is a further development product based on, for example, a programmable array logic (PAL), a general array logic (GAL), a complex programmable logic device (CPLD), or another programmable device. The FPGA as a semi-custom device in the field of ASIC not only solves the deficiencies of the custom device but also overcomes the shortcomings of a limited number of original programmable devices. A system designer can connect logic blocks inside the FPGA through editable connections according to actual needs, just as if a device board is placed on a chip. The logic blocks and connections inside a factory-finished FPGA can be changed by the designer, such that the FPGA can perform the required logic functions.

In some embodiments, the photographing system 100 can directly perform viewing and focusing through the CCD or the CMOS of the photographing device 110.

Figure 2:
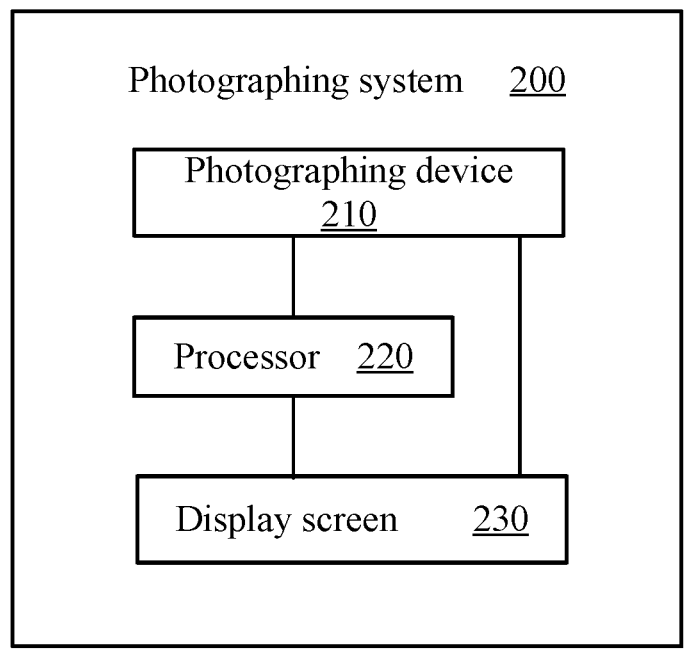
FIG. 2 is a schematic structural diagram of another photographing system according to an example embodiment.

FIG. 2 is a schematic structural diagram of another photographing system 200 consistent with the disclosure. As shown in FIG. 2, the photographing system 200 is similar to the photographing system 100 described above and includes a photographing device 210 and a processor 220. The function and structure of the photographing device 210 are similar to those of the above-described photographing device 110. The function and structure of the processor 220 are similar to those of the above-described processor 120 and detailed description is omitted here. Unlike the photographing system 100 described above, the photographing system 200 is configured to have a display screen 230. In some embodiments, the display screen 230 can be a liquid crystal display (LCD).

The display 230 is communicatively connected to the photographing device 210. the display screen 230 can obtain an image captured by the photographing device 210 and display the image.

In some embodiments, the processor 220 can have image processing functions (e.g., zoom in, zoom out, or the like), such that the image displayed by the display screen 230 can be an image processed by the processor 220. In some embodiments, the display screen 230 can display images provided by a LiveView function. The LiveView function can make the images viewed by the photographing device 210 to be displayed on the display screen 230 (for example, a LCD) in real-time, which greatly facilitates the user's view composition.

In some embodiments, the photographing system 200 can perform viewing and focusing directly through the CCD or the CMOS of the photographing device 210. That is, the display screen 230 can directly display the images viewed by the CCD or the CMOS.

In some embodiments, the processor 220 can also perform a focus process based on the image viewed by the CCD or CMOS and perform a digital zoom process on the image during the focus process (i.e., a first digital zoom process which will be described in detail below). Accordingly, the display screen 230 can also display the image processed by the processor 220.

In some embodiments, components in the photographing system 100 or 200 can be integrated in a same device. The device can be, for example, a camera, a video camera, or a smart terminal device having an image photographing function (such as a cell phone, a tablet, a laptop, or the like).

In some other embodiments, the components in the photographing system 100 or 200 described above can also be arranged in different devices. For example, the above-described photographing device can be arranged in an unmanned aerial vehicle (UAV), and the display screen may be arranged in a control terminal (for example, a remote controller or a smart terminal installed with a control program) that can communicate with the UAV. The above-described processor can be arranged in the UAV or can be arranged in the control terminal, which is not limited in the present disclosure.

The UAVs have been evolved from military applications to civilian applications, such as the UAV plant protection, UAV aerial photography, UAV forest fire surveillance, or the like. Civilian applications are a trend of UAV's future development.

Figure 3:
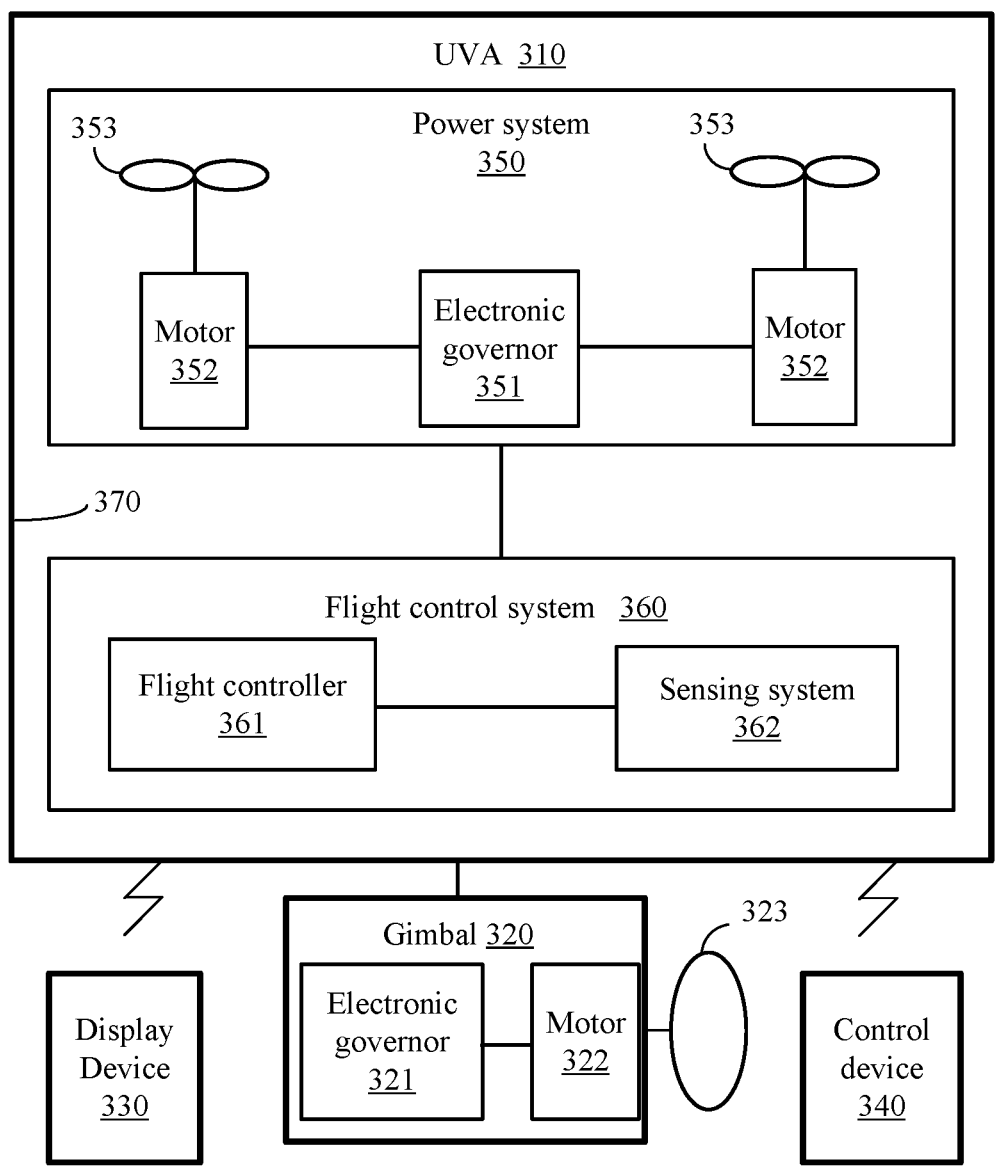
FIG. 3 is a schematic structural diagram of an unmanned aerial system according to an example embodiment.

In some scenarios, the UAV can carry a payload for performing a specific task through a carrier. For example, when the UAV is used for aerial photography, the UAV can carry a photographing device, i.e., the photographing device described above, through a gimbal. FIG. 3 is a schematic structural diagram of an unmanned aerial system 300 consistent with the disclosure. A rotorcraft is taken as an example of the unmanned aerial system 300 for illustration.

The unmanned aerial system 300 includes a UAV 310, a gimbal 320, a display device 330, and a control device 340. The UAV 310 includes a power system 350, a flight control system 360, a rack 370, and a focus processor (not shown in FIG. 3). The UAV 310 is communicatively connected with the control device 340 and the display device 330.

The rack 370 can include a fuselage and one or more stands (also referred to as landing gears). The fuselage may include a central bracket and one or more arms connected to the central bracket. The one or more arms extend radially from the central bracket. The one or more stands can be connected to the fuselage and can be configured to support the UAV 310 when the UAV 310 is landing.

The power system 350 includes an electronic speed governor (or simply, electronic governor) 351, one or more propellers 353, and one or more motors 352 corresponding to the one or more propellers 353. Each of the one or more motors 352 is connected between the electronic governor 351 and one of the one or more propellers 353, and each of the one or more motors 352 and the corresponding propeller 353 are arranged on the corresponding arm. The electronic governor 351 is configured to receive a drive signal generated by the flight control system 360 and provide a drive current to each of the one or more motors 352 according to the drive signal to control a rotation speed of each of the one or more motors 352. The one or more motors 352 are configured to drive the one or more propellers to rotate, thereby providing power for the UAV 310 to flight. The power can enable the UAV 310 to achieve one or more degrees of freedom of motion. In some embodiments, the UAV 310 can rotate about one or more rotation axis. For example, the one or more rotation axis may include a roll axis, a yaw axis, and a pitch axis. The one or more motors 352 can be direct current (DC) motors or alternating current (AC) motors. In addition, the one or more motors 352 can be brushless motors or brush motors.

The flight control system 360 includes a flight controller 361 and a sensing system 362. The sensing system 362 can be configured to measure attitude information of the UAV 310, i.e., position information and status information of the UAV 310 in space, for example, three-dimensional position, three-dimensional angle, three-dimensional velocity, three-dimensional acceleration, three-dimensional angular velocity, or the like. The sensing system 362 can include at least one of, for example, a gyroscope, an electronic compass, an Inertial Measurement Unit (IMU), a vision sensor, a Global Positioning System (GPS), and a barometer. The flight controller 361 can be configured to control the flight of the UAV 310. For example, the flight of the UAV 310 can be controlled based on the attitude information measured by the sensing system 362. In some embodiments, the flight controller 361 can control the UAV 310 according to preprogrammed program instructions and can also control the UAV 310 by responding to one or more control commands from the control device 340.

The gimbal 320 includes an electronic governor 321 and one or more motors 322. The gimbal 320 can be configured to carry the photographing device 323. The structure and function of the photographing device 323 are similar to those of the photographing device 110 or 120 described above and detailed description is omitted here.

The flight controller 361 can control a motion of the gimbal 320 through the electronic governor 321 and the one or more motors 322. In some embodiments, the gimbal 320 can also include a controller configured to control the motion of the gimbal 320 through the electronic governor 321 and the one or more motors 322. The gimbal 320 can be separate from the UAV 310 or can be a part of the UAV 310. The one or more motors 322 can be DC motors or AC motors. In addition, the one or more motors 322 can be brushless motors or brush motors. The gimbal can be arranged at a top of the UAV or at a bottom of the UAV.

The unmanned aerial system 300 can also include the focus processor (not shown in FIG. 3). The focus processor can be configured to control the photographing device 323 to focus. The structure and function of the focus processor are similar to those of the processor 120 or 220 described above and detailed description is omitted here. The focus processor can be arranged at the UAV 310, the control device 340, or the display device 330, which is not limited in the present disclosure.

In some embodiments, the display device 330 can be arranged at a ground terminal of the unmanned aerial system 300 and can communicate with the UAV 310 wirelessly. The display device 330 can be configured to display the attitude information of the UAV 310, as well as the images captured by the photographing device 323. The display device 330 can be a stand-alone device or can be provided in the control device 340.

In some embodiments, the control device 340 can be arranged at the ground terminal of the unmanned aerial system 300, can communicate with the UAV 310 wirelessly, and can be configured to remotely control the UAV 310. The control device can be, for example, a remote controller or a terminal device, for example, a smartphone, a tablet, or the like, installed with an application (app) that controls the UAV. In some embodiments, the UAV can be controlled by receiving a user input from the control device. The user input can refer to an input from an input device, such as a pull wheel, a button, a key, a joystick, or a user interface (UI) on the terminal device.

In some embodiments, the focus processor can be a dedicated processor that is independently configured, or the function of the focus processor can also be provided by a processor of another device in the unmanned aerial system 300 (for example, a processor that controls the control device 340 or the photographing device 232), which is not limited by the present disclosure.

It should be appreciated that the above naming of the components of the unmanned aerial system is merely for identification purposes and should not be construed as a limitation of the embodiments of the present disclosure.

Hereinafter, the actions and interactions of the photographing device, the processor, and the display screen in the focus process will be described in detail.

FIG. 4 is a schematic flow chart of a focus method 400 consistent with the disclosure. As shown in FIG. 4, at S410, a first image is captured and a focusing area in the first image is determined. The focusing area includes at least one pixel.

At S420, a first digital zoom process is performed on the focusing area to obtain a second image, according to a preset zoom-in ratio. The second image includes an enlarged focusing area, and a signal-to-noise ratio (SNR) of the second image is greater than the SNR of the focusing area.

At S430, a focus process is performed on the second image.

In some embodiments, at S410, the photographing device of the photographing system can capture an image A (i.e., an example of the first image) using a focus distance A and send the captured image A to the processor.

After receiving the image A, the processor can determine an image A' (i.e., an example of the focusing area) used in the focus process in the image A.

In some embodiments, the image A' can be an image at a predetermined position in the image A, and the image A' can include at least one pixel.

In some embodiments, the predetermined position can be a preset position by a manufacturer or a user. For example, the predetermined position can be a position in the image (e.g., the image A) that is near a geometric center of the image.

In some embodiments, the predetermined position can also be determined based on a photographed scene. For example, when the photographing device has a specific scene (e.g., a face) recognition function, the predetermined position can be a position where the specific scene is displayed in an image (for example, the image A).

In some embodiments, the photographing system can have a digital zoom function, and the image A can be an image captured using the focus distance A and a zoom factor A (i.e., an example of a first digital zoom factor described below). That is, the zoom factor of the image A is also referred to as the zoom factor A.

In some embodiments, at S420, the processor can perform a digital zoom process A (i.e., an example of the first digital zoom process) on the image A'. The digital zoom process A is a digital zoom process using a preset zoom-in ratio K (i.e., an example of the zoom-in ratio) to generate an image B (i.e., an example of the second image). Herein, the zoom factor of the image B is referred to as a zoom factor B.

The number of pixels included in the image B is larger than the number of pixels included in the image A', and the SNR of the image B is larger than the SNR of the image A'.

In some embodiments, the digital zoom process A can realize zoom-in by increasing an area of each pixel in the image A'. That is, the digital zoom process A can use a part of the image sensor for imaging (i.e., a part corresponding to the above-described focusing area), which is equivalent to taking the focusing area out from the original image and zooming in the focusing area.

For example, the processor can use an interpolation process to zoom in some pixels (i.e., pixels corresponding to the focusing area) of the image sensor (for example, the CCD or CMOS). For example, the processor can determine the color values (for example, grayscale values) around the existing pixels (i.e., the pixels corresponding to the focusing area), and insert the pixels derived by a certain algorithm according to a surrounding color condition.

In some embodiments, the focus distance of the lens is not changed in the digital zoom process A.

Hereinafter, the example method and process of the digital zoom process A will be described in detail.

In some embodiments, the second image can include a plurality of original pixels and a plurality of interpolated pixels. The original pixels refer to the pixels of the focusing area.

Performing the first digital zoom process on the focusing area using the preset zoom-in ratio can include the following processes. According to a position of a first interpolated pixel of the plurality of interpolated pixels in the second image, N reference original pixels in the focus area that correspond to the first interpolated pixel can be determined, where N is an integer and $N \geq 1$. A grayscale value of the first interpolated pixel can be determined, according to the preset zoom-in ratio and the grayscale values of the N reference original pixels.

In some embodiments, the image B can include two kinds of pixels that are referred to as α pixels (i.e., an example of the original pixels) and β pixels (i.e., an example of the interpolated pixels), respectively.

The image B can include a plurality of α pixels, and each α pixel is a pixel in image A'.

The image B can also include a plurality of β pixels, and each β pixel is a pixel generated based on some of the plurality of α pixels (e.g., generated based on the grayscale values of some pixels in image A').

For example, when the zoom factor is K, if the image A' includes R×Q pixels, the image B can include (K×R)×(K×Q) pixels. R is an integer greater than or equal to 2 and Q is an integer greater than or equal to 2.

For example, the pixel in a position (K×i, K×j) of the image B is an α pixel. That is, the pixel value of the pixel in the position (K×i, K×j) of the image B equals to the pixel value of the pixel in a position (i, j) of the image A', where i and j are integers and $i \in [0, R]$, $j \in [0, Q]$. The pixel in a position of (K×i+v, K×j+u) of the image B is a β pixel, where i, j, v, and u are integers and $i \in [0, R]$, $j \in [0, Q]$, $v \in [1, R-1]$, $u \in [1, Q-1]$.

In some embodiments, determining a β pixel (hereinafter, referred to as β pixel #1) may need N α pixels (hereinafter, referred to as α pixel #1 to α pixel #N).

Hereinafter, using the α pixel #1 to the α pixel #N to determine the β pixel will be described in detail.

In some embodiments, determining the N reference original pixels corresponding to the first interpolated pixel from at least one original pixels according to the position of the first interpolated pixel of the plurality of interpolated pixels in the second image can include the following processes. According to the preset zoom-in ratio and the position of the first interpolated pixel in the second image, a first reference original pixel in the focusing area can be determined. The position of the first reference original pixel in the focusing area corresponds to the position of the first interpolated pixel in the second image. According to the first reference original pixel, N−1 second reference original pixels in the focusing area can be determined. The positional relationship between the N−1 second reference original pixels and the first reference original pixel can satisfy a preset position condition.

In some embodiments, the N α pixels are pixels that are at preset positions in the image A', and the preset positions correspond to the zoom-in ratio K (i.e., the preset zoom-in ratio) of the digital zoom processing A. K is an integer greater than or equal to 2.

K=2, v=1, u=1 are taken as an example for illustration. That is, the position of the β pixel #1 in the image B is (2×i+1, 2×j+1), where i∈[0, R], j∈[0, Q].

The processor can determine the corresponding pixel in the image A' that corresponds to the β pixel #1, according to the zoom factor and the position of the β pixel #1 in the image B. The corresponding pixel is an example of the first reference original pixel. Hereinafter, the corresponding pixel is referred to as corresponding pixel #1.

A coordinate of the corresponding pixel #1 is (x, y), and the processor can determine a value of x according to the following formula:

$$x = \lfloor 1/2 \times (2 \times i + 1) \rfloor = i$$

where $\lfloor \; \rfloor$ represents a rounding operation.

The processor can also determine a value of y according to the following formula:

$$y = \lfloor 1/2 \times (2 \times j + 1) \rfloor = j$$

For example, for a pixel in a position of (K×i+v, K×j+u) in image B, the corresponding pixel in image A' can be a pixel at position (i, j) in image A'.

The processor can determine space distances $dx$, $dx^2$, $dx^3$, $dy$, $dy^2$, and $dy^3$ between the β pixel #1 and the corresponding pixel #1, according to the following formulas:

$$dx = 1/2 \times (2 \times i + 1) - x = 1/2$$

$$dx^2 = dx \times dx = 1/2^2 = 1/4$$

$$dx^3 = dx^2 \times dx = 1/2^3 = 1/8$$

$$dy = 1/2 \times (2 \times j + 1) - y = 1/2$$

$$dy^2 = dy \times dy = 1/2^2 = 1/4$$

$$dy^3 = dy^2 \times dy = 1/2^3 = 1/8$$

In some embodiments, the α pixel #1 to the α pixel #N include the corresponding pixel #1. The positional relationship between the corresponding pixel #1 and the pixels (referred to as interpolating pixels) other than the corresponding pixel #1 in the α pixel #1 to the α pixel #N can satisfy the preset position condition. For example, a distance between each interpolating pixel and the corresponding pixel #1 in X-axis is less than or equal to a first preset distance threshold (for example, 2), and a distance between each interpolating pixel and the corresponding pixel #1 in Y-axis is less than or equal to a second preset distance threshold (for example, 2).

In some embodiments, the preset position condition can be determined according to the preset zoom-in ratio.

FIG. 5 schematically shows the positions of the α pixel #1 to the α pixel #N consistent with the disclosure. As shown in FIG. 5, the coordinate of the corresponding pixel #1 as described above is (i, j), the α pixel #1 to the α pixel #N can be the following pixels in the image A':

| | |
|---|---|
| (i−1,j−1),(i,j−1),(i+1,j−1),(i+2,j−1) | a first pixel group |
| (i−1,j),(i,j),(i+1,j),(i+2,j) | a second pixel group |
| (i−1,j+1),(i,j+1),(i+1,j+1),(i+2,j+1) | a third pixel group |
| (i−1,j+2),(i,j+2),(i+1,j+2),(i+2,j+2) | a fourth pixel group |

The α pixel #1 to the α pixel #N described above are merely examples, but not intended to limit the selection of the α pixel #1 to the α pixel #N. Any pixels in the images A' can be the α pixel #1 to the α pixel #N, as long as the positional relationship between the interpolating pixels and the corresponding pixel #1 can satisfy the preset position condition. For example, when the first distance threshold is 2 and the second distance threshold is 2, the α pixel #1 to the α pixel #N can also be the following pixels in the image A':

| | |
|---|---|
| (i−2,j−1),(i−1,j−1),(i,j−1),(i+1,j−1) | the first pixel group |
| (i−2,j),(i−1,j),(i,j),(i+1,j) | the second pixel group |
| (i−2,j+1),(i−1,j+1),(i,j+1),(i+1,j+1) | the third pixel group |
| (i−2,j+2),(i−1,j+2),(i,j+2),(i+1,j+2) | the fourth pixel group |

The processor can determine the pixel value of the β pixel #1 (for example, the grayscale value), according to the pixel values of the α pixel #1 to the α pixel #N described above.

In some embodiments, the processor can respectively obtain an intermediate value $t_0$ of the first pixel group, an intermediate value $t_1$ of the second pixel group, an intermediate value $t_2$ of the third pixel group, and an intermediate value $t_3$ of the fourth pixel group according to the following formulas:

$$a_1 = -p_0/2 + (3 \times p_1)/2 - (3 \times p_2)/2 + p_3/2$$

$$b_1 = p_0 - (5 \times p_1)/2 + 2 \times p_2 - p_3/2$$

$$c_1 = -p_0/2 + p_2/2$$

$$d_1 = p_1$$

$$t = a_1 \times dx^3 + b_1 \times dx^2 + c_1 \times dx + d_1$$

For example, the processor can set the pixel value of (i−1, j−1) included in the first pixel group as $p_0$, the pixel value of (i, j−1) included in the first pixel group as $p_1$, the pixel value of (i+1, j−1) included in the first pixel group as $p_2$, and the pixel value of (i+2, j−1) included in the first pixel group as $p_3$ to obtain to according to the above-described formulas.

The processor can set the pixel value of (i−1, j) included in the second pixel group as $p_0$, the pixel value of (i, j) included in the second pixel group as $p_1$, the pixel value of (i+1, j) included in the second pixel group as $p_2$, and the pixel value of (i+2, j) included in the second pixel group as $p_3$ to obtain $t_1$ according to the above-described formulas.

The processor can set the pixel value of (i−1, j+1) included in the third pixel group as $p_0$, the pixel value of (i, j+1) included in the third pixel group as $p_1$, the pixel value of (i+1, j+1) included in the third pixel group as $p_2$, and the pixel value of (i+2, j+1) included in the third pixel group as $p_3$ to obtain $t_2$ according to the above-described formulas.

The processor can set the pixel value of (i−1, j+2) included in the fourth pixel group as $p_0$, the pixel value of (i, j+2) included in the fourth pixel group as $p_1$, the pixel value of (i+1, j+2) included in the fourth pixel group as $p_2$, and the pixel value of (i+2, j+2) included in the fourth pixel group as $p_3$ to obtain $t_3$ according to the above-described formulas.

The processor can determine the pixel value w of the β pixel #1 using $t_0$ to $t_3$ determined as described above based on the following formulas:

$$a_2=-t_0/2+(3 \cdot xt_1)/2-(3 \cdot xt_2)/2+t_3/2$$

$$b_2=t_0-(5 \cdot xt_1)/2+2 \cdot xt_2-t_3/2$$

$$c_2=-t_0/2+t_2/2$$

$$d_2=t_1$$

$$w=a_2 \cdot xdy^3+b_2 \cdot xdy^2+c_2 \cdot xdy+d_2$$

Similarly, the processor can determine the pixel value of each β pixel in the image B. Further, the processor can determine the pixel value of each β pixel in the image B and the pixel value of the α pixel to determine the image B.

In some embodiments, at S430, the processor can perform the focus process using the image B. For example, in-focus and out-of-focus images have the following observations. When being focused, the in-focus image has the strongest contrast, a larger deviation of the out-of-focus image from the focused imaged corresponds to a lower contrast of the out-of-focus image. Taking a one-dimensional CCD as an example for contrast detection, if an output of an $n_{th}$ light receiving element (e.g., the $n_{th}$ photodiode) is set as $I_n$, a contrast-evaluation function can be:

$$E = \sum_{n=1}^{m} |I_{n+1} - I_{n-1}|$$

where m denotes a total number of pixels in the one-dimensional CCD. E has a maximum value $E_{max}$ in a focus position. In pre-focus and post-focus positions, E will decrease as a defocus offset increases. If the defocus offset is particularly large, E tends to be zero.

In some embodiments, a small-size auxiliary reflector can be provided behind a semi-transparent reflector of a view-finder in a processor-controlled auto-focus system, which can reflect a beam toward a bottom of the camera and into a detection assembly. After passing through an infrared filter, the beam can be divided by a prism to generate two images. One of the two images is equivalent to a pre-focus equivalent surface $S_1$, and another one of the two images is equivalent to a post-focus equivalent surface $S_2$. A distance between $S_1$ and an image plane of the camera and a distance between $S_2$ and the image plane are l. Two one-dimensional CCD can be arranged at $S_1$ and $S_2$. When a position of the lens is changing, contrast-change curves (also referred to as evaluation-value change curves) $E_1$ and $E_2$ can be obtained at $S_1$ and $S_2$, respectively. If an initial position of the lens is at the pre-focus position and the lens moves toward a post-focus direction in the focus process, the contrast curve $E_1$ can first reach the maximum value and the contrast curve $E_2$ can reach the maximum value later. On the contrary, when the initial position of the lens is at the post-focus position, the contrast curve $E_2$ can first reach the maximum value and the contrast curve $E_1$ can reach the maximum value later. When the initial position of the lens is at the focus position, i.e., in the middle of the pre-focus plate and the post-focus plate, the contrast curves $E_1$ and $E_2$ are the same. That is, $E_1$ being greater than $E_2$ means the lens is at a pre-focus position and $E_1$ being smaller than $E_2$ means the lens is at a post-focus position.

In some embodiments, the first image can be an image frame or a plurality of image frames, which is not limited in the present disclosure. Detailed description of the processor performing the focus process based on the plurality of image frames is omitted here.

The focus distance A can be changed to a focus distance B determined through the above-described focus process. The photographing device can capture images using the focus distance B.

In some embodiments, the focus method 400 also includes displaying the first image after obtaining the first image and displaying the second image after obtaining the second image.

In some embodiments, the photographing system can also include a display screen and can display the image A captured by the photographing device and the image B generated by the processor on the display screen.

In some embodiments, the focus method 400 also includes the following process. A second digital zoom process can be performed, according to a preset zoom-out ratio, such that the currently used digital zoom factor can be changed from the second digital zoom factor to the first digital zoom factor. The preset zoom-out ratio corresponds to the preset zoom-in ratio. The first digital zoom factor is the digital zoom factor before the first digital zoom process, and the second digital zoom factor is the digital zoom factor after the first digital zoom process. The first image is the image captured using the first focus distance. The focus distance obtained after the focus process is the second focus distance.

The focus method also includes capturing a third image using the first digital zoom factor and the second focus distance, and displaying the third image.

In some embodiments, the focus process performed by the processor described above can be performed simultaneously with a LiveView process displayed on the display screen.

For example, after the photographing device obtains the image A during a time period A (also referred to as a first time period), the display screen can display the image A during the time period A. The image A can be an image captured using the focus distance A and the zoom factor A. The zoom factor A can be an initial digital zoom factor of the photographing system (e.g., a zoom factor that is not subjected to the digital zoom process, for example, 1 time), or can be a digital zoom factor adjusted by the user, which is not limited in the present disclosure. That is, the LiveView (i.e., an example of the first image) obtained using the focus distance A and the zoom factor A can be displayed on the display screen.

A time period after the processor performs the digital zoom process A on the image A to generate the image B and before the processor determines the focus distance B can be denoted as a time period B (also referred to as a second period), during which the image B can be displayed on the display screen. That is, after the processor performs the above-described digital zoom process using the zoom-in ratio K, the zoom factor can be changed to the zoom factor B. As such, the LiveView (i.e., an example of the second image) obtained using the focus distance A and the zoom factor B can be displayed on the display screen.

A time period after the processor completes the focus process and determine the focus distance B can be denoted as a time period C (also referred to as a third period), during which the processor can adjust the digital zoom factor from the zoom factor B to the zoom factor A, and the LiveView (i.e., an example of the third image) obtained using the focus distance B and the zoom factor A can be displayed on the display screen.

Therefore, the user can identify the change of the image during the focus process through the LiveView on the display screen, such that the user experience and participation in the photographing process can be enhanced.

According to the disclosure, the focus method can perform the first digital zoom process on the focusing area to zoom-in the focusing area, such that the SNR of the enlarged focusing area can be increased, the evaluation-value change curve can be smoothed, which facilitates a peak search of the evaluation-value change curve, speeds up the peak search, and increases an accuracy of the peak search, thereby improving the focus speed and the focus accuracy.

FIG. 6 is a schematic flow chart of an image photographing method 500 consistent with the disclosure. As shown in FIG. 6, at S510, a first image is captured using a first digital zoom factor and a first focus distance, the first image is displayed, and a focusing area in the first image is determined. The focusing area includes at least one pixel and the focusing area includes some pixels of the first image.

At S520, a first digital zoom process is performed on the focusing area using a preset zoom-in ratio to obtain a second image, and the second image is displayed. The second image includes an enlarged focusing area, and an SNR of the second image is greater than the SNR of the focusing area. The digital zoom factor obtained after the first digital zoom process is a second digital zoom factor.

At S530, a focus process is performed to determine a second focus distance using the second image.

At S540, a second digital zoom process is performed, according to a preset zoom-out ratio, such that a currently used digital zoom factor is changed from the second digital zoom factor to the first digital zoom factor. The preset zoom-out ratio corresponds to the preset zoom-in ratio.

At S550, a third image is captured and displayed using the first digital zoom factor and the second focus distance, and the third image is displayed.

In some embodiments, at S510, the photographing device of the photographing system can capture an image A (i.e., an example of the first image) using a focus distance A and send the captured image A to the processor. The image A is an image captured using a zoom factor A. The zoom factor A can be a preset zoom factor of the photographing system or a zoom factor adjusted by the user, which is not limited by the disclosure.

The actions and processes of the processor and the photographing device at S510 are similar to the actions and processes performed by the processor and the photographing device at S410 in the method 400 described above and detailed description is omitted here.

Before the processor performs the digital zoom process on the image A (i.e., a time period A), a LiveView (i.e., an example of the first image) captured using the focus distance A and the zoom factor A can be displayed on the display screen.

The image A can be obtained by the display screen from the processor (for example, when the zoom factor A is not 1 time), or can be obtained by the display screen from the photographing device (for example, when the zoom factor A is 1 time), which is not limited in the present disclosure.

In some embodiments, at S520, the processor can perform the first digital zoom process on an image A' to generate an image B (i.e., an example of the second image). Assume that the zoom factor obtained after the first digital zoom process is a zoom factor B, the image B can be an image obtained using the focus distance A and the zoom factor B.

The actions and processes of the processor at S520 are similar to the actions and processes performed by the processor at S420 in the method 400 described above and detailed description is omitted here.

In some embodiments, at S530, the processor can perform the focus process based on the image B. The focus distance A can be changed by the above-described focus process to determine a focus distance B.

After the processor performs the digital zoom process A on the image A to generate the image B and before the processor determines the focus distance B (i.e., a time period B), a LiveView (i.e., an example of the second image) captured using the focus distance A and the zoom factor B can be displayed on the display screen.

In some embodiments, at S540, the processor can adjust the digital zoom factor from the zoom factor B to the zoom factor A.

In some embodiments, at S550, the photographing device of the photographing system can capture the image C (i.e., an example of the third image) using the focus distance B. The image C is an image captured using the zoom factor A.

After the processor completes the focus process and determines the focus distance B (i.e., a time period C), the processor can change the digital zoom factor from the zoom factor B to the zoom factor A, and a LiveView (i.e., an example of the third image) captured using the focus distance B and the zoom factor A can be displayed on the display screen.

Therefore, the user can identify the change of the image during the focus process through the LiveView on the display screen, such that the user experience and participation in the photographing process can be enhanced.

Figure 7:
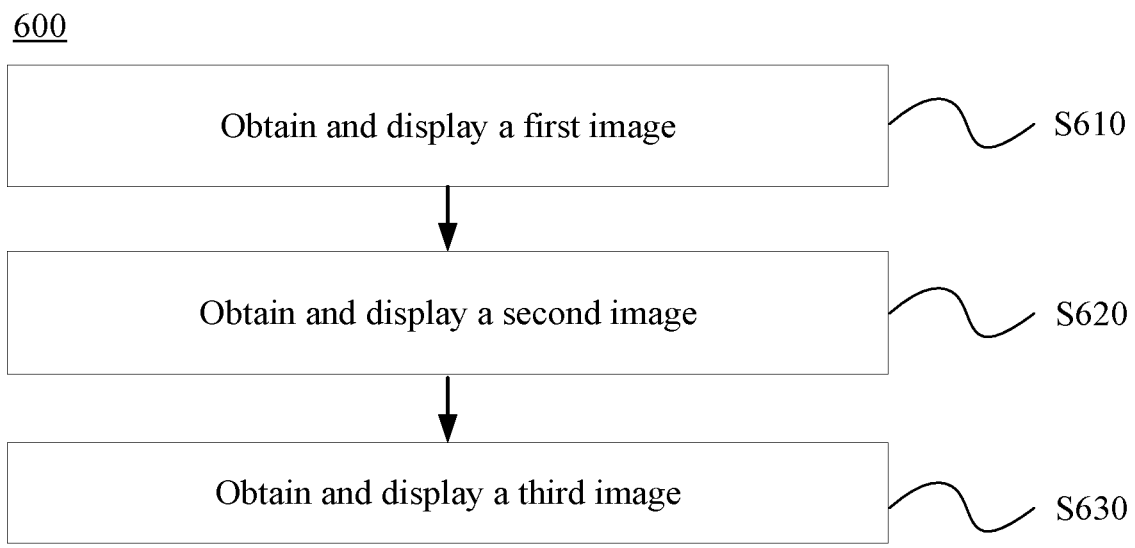
FIG. 7 is a schematic flow chart of an image display method according to an example embodiment.

FIG. 7 is a schematic flow chart of an image display method 600 consistent with the disclosure. The image display method 600 can be implemented on a display screen or a display device.

As show in FIG. 7, at S610, a first image is obtained and displayed. The first image is an image captured using a first digital zoom factor and a first focus distance.

At S620, a second image is obtained and displayed. The second image is an image obtained by performing a first digital zoom process on a focusing area in the first image using a preset zoom-in ratio. The focusing area includes at least one pixel. The second image includes an enlarged focusing area, and an SNR of the second image is greater than the SNR of the focusing area.

At S630, a third image is obtained and displayed. The third image is an image captured using the first digital zoom factor and a second focus distance. The second focus distance is a focus distance determined by a focus process using the second image.

In some embodiments, the photographing device of the photographing system can capture an image A (i.e., an example of the first image) using a focus distance A and send the captured image A to the processor.

At S610, the display screen can obtain and display the image A. For example, before the processor performs the digital zoom process on the image A (i.e., a time period A), a LiveView (i.e., an example of the first image) captured using the focus distance A and the zoom factor A can be displayed on the display screen.

The image A can be an image obtained using the zoom factor A. The zoom factor A can be a preset zoom factor of the photographing system or a zoom factor adjusted by the user, which is not limited in the present disclosure.

The actions and processes of the processor and the photographing device at S610 are similar to the actions and processes performed by the processor and the photographing device at S410 in the method 400 described above and detailed description is omitted here.

The image A can be obtained by the display screen from the processor (for example, when the zoom factor A is not 1 time), or can be obtained by the display screen from the photographing device (for example, when the zoom factor A is 1 time), which is not limited in the present disclosure.

The processor can perform the first digital zoom process on an image A' to generate an image B (i.e., an example of the second image). Assume that the zoom factor obtained after the first digital zoom process is a zoom factor B, the image B can be an image obtained using the focus distance A and the zoom factor B.

At S620, the display screen can obtain and display the image B. For example, after the processor performs the digital zoom process A on the image A to generate the image B and before the processor determines the focus distance B (i.e., a time period B), a LiveView (i.e., an example of the second image) captured using the focus distance A and the zoom factor B can be displayed on the display screen.

The actions and processes of the processor at S620 are similar to the actions and processes performed by the processor at S420 in the method 400 described above and detailed description is omitted here.

The processor can perform the focus process using the image B. The focus distance A can be changed by the above-described focus process to determine a focus distance B.

The actions and processes of the processor at S630 are similar to the actions and processes performed by the processor at S430 in the method 400 described above and detailed description is omitted here.

The processor can adjust the digital zoom factor from the zoom factor B to the zoom factor A.

The photographing device of the photographing system can capture the image C (e.g., an example of the third image) using the focus distance B. The image C is an image captured using the zoom factor A.

For example, after the processor completes the focus process and determines the focus distance B (i.e., a time period C), the processor can change the digital zoom factor from the zoom factor B to the zoom factor A.

At S630, the display screen can obtain and display the image C. For example, a LiveView (i.e., an example of the third image) captured using the focus distance B and the zoom factor A can be displayed on the display screen.

Therefore, the user can identify the change of the image during the focus process through the LiveView on the display screen, such that the user experience and participation in the photographing process can be enhanced.

Figure 8:
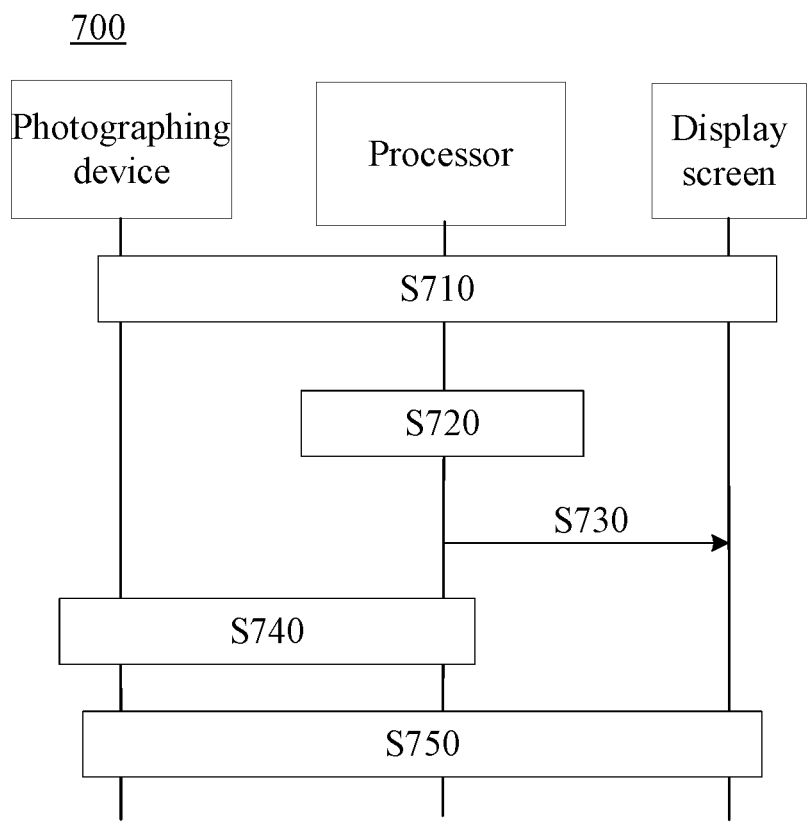
FIG. 8 schematically shows an interaction process of an image photographing method and an image display method according to an example embodiment.

FIG. 8 schematically shows an interaction process 700 of an image photographing method and an image display method consistent with the disclosure. As shown in FIG. 8, at S710, a photographing device and a processor capture an image A using a focus distance A and a zoom factor A, and send the image A to a display screen for displaying the image A.

At S720, the processor performs a digital zoom process (i.e., an example of a zoom-in process) using a zoom-in ratio K on a focusing area (for example, the above-described image A') in the image A to capture the image B. Assume that the zoom factor obtained after the digital zoom process is a zoom factor B, the zoom factor B equals to K·times the zoom factor A.

At S730, the processor sends the image B to the display screen. The display screen displays the image B.

At S740, the processor performs the focus process on the image B to determine a focus distance B, and after determining the focus distance B, a currently used digital zoom factor is changed from the zoom factor B to the zoom factor A.

At S750, the photographing device and the processor capture an image C using the focus distance B and the zoom factor A, and send the image C to the display screen for displaying the image C.

According to the disclosure, the focus method can perform the first digital zoom process on the focusing area to zoom-in the focusing area, such that the SNR of the enlarged focusing area can be increased, the evaluation-value change curve can be smoothed, which facilitates a peak search of the evaluation-value change curve, speeds up the peak search, and increases an accuracy of the peak search, thereby improving the focus speed and the focus accuracy.

Figure 9:
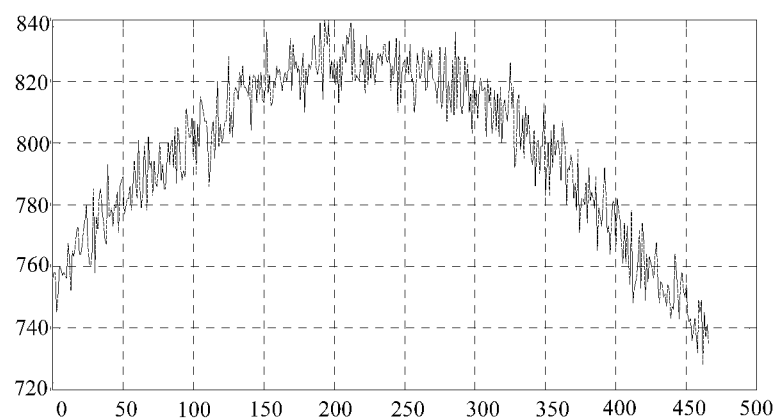
FIG. 9 schematically shows an evaluation-value change curve in a conventional focus process.
Figure 10:
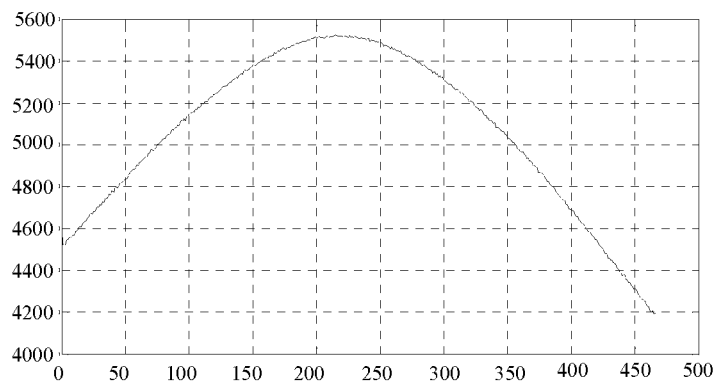
FIG. 10 schematically shows an evaluation-value change curve in a focus process according to an example embodiment.
Figure 11:
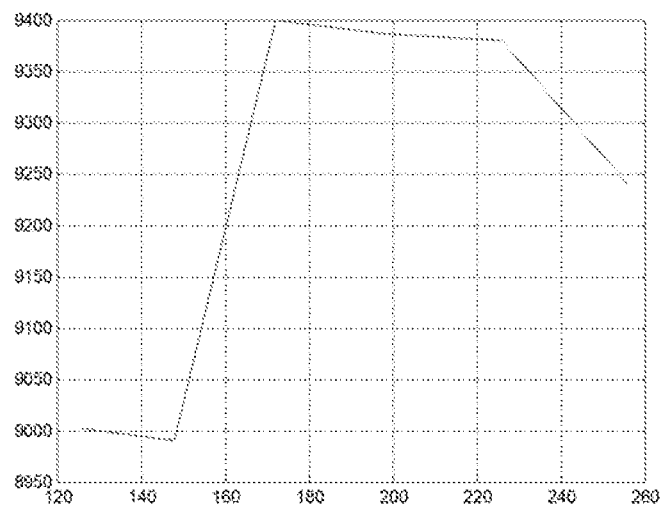
FIG. 11 schematically shows a change of a near-peak point value of the evaluation-value change curve in the conventional focus process.
Figure 12:
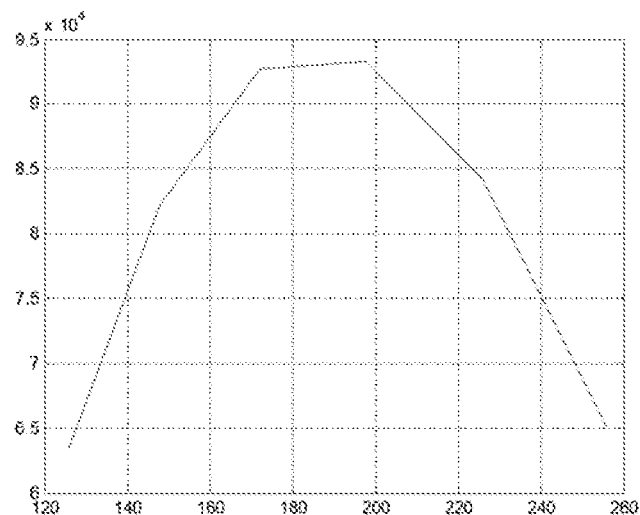
FIG. 12 schematically shows a change of a near-peak point value of an evaluation-value change curve in a focus process according to an example embodiment.

FIG. 9 schematically shows an evaluation-value change curve in a conventional focus process. FIG. 10 schematically shows an evaluation-value change curve in a focus process consistent with the disclosure. FIG. 11 schematically shows a change of a near-peak point value of the evaluation-value change curve in the conventional focus process. FIG. 12 schematically shows a change of a near-peak point value of the evaluation-value change curve in the focus process consistent with the disclosure.

As shown in FIGS. 9 and 11, the focusing area in the conventional focus process is relatively small, thus, the SNR is relatively small. As a result, a fluctuation of the contrast-change curve used in the focus process is relatively large, or in other words, the smoothness of the contrast-change curve is relatively poor. As such, the length of the focus process (mainly a peak search process) is long and the accuracy is poor.

In contrast, as shown in FIGS. 10 and 12, by performing the first digital zoom process on the focusing area, the area of the focusing area can be increased (i.e., the number of pixels included in the focusing area can be increased). Since the added pixels are the pixels determined by the interpolation algorithm based on the pixels at the predetermined positions in the original image, the noise in the added pixels can be effectively reduced and the SNR of the focusing area after the digital zoom process can be improved. As such, the fluctuation of the contrast-change curve used in the focus process can be reduced, the smoothness of the contrast-change curve can be improved, thereby shortening the length of the focus process (mainly the peak search process) and improving the accuracy of the focusing process (mainly the peak search process).

In some embodiments, for FIGS. 9 to 12, a horizontal ordinate can be a position of the focus motor and a vertical ordinate can be the contrast value calculated in the focusing area of the captured image corresponding to the position of the focus motor.

Hereinafter, a focus apparatus, an image photographing apparatus, and an image display apparatus will be described in detail.

Figure 13:
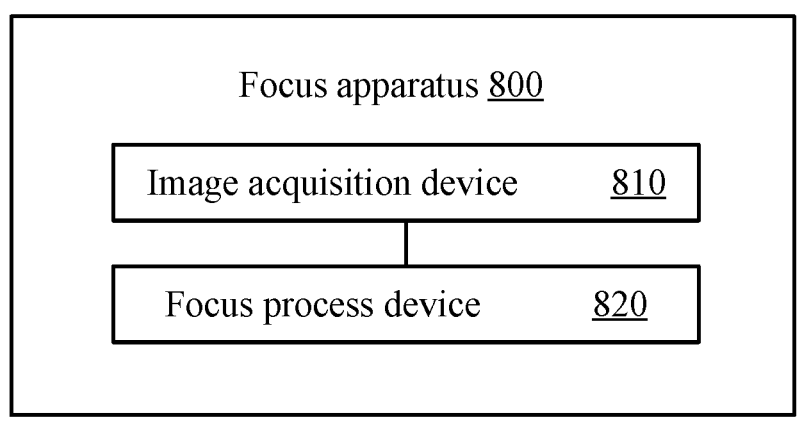
FIG. 13 is a schematic structural diagram of a focus apparatus according to an example embodiment.

FIG. 13 is a schematic structural diagram of a focus apparatus 800 consistent with the disclosure. As shown in FIG. 13, the focus apparatus 800 includes an image acquisition device 810 and a focus process device 820. The image acquisition device 810 is configured to capture a first image. The focus process device 820 is configured to determine a focusing area in the first image. The focusing area includes at least one pixel. The focus process device 820 is also configured to perform a first digital zoom process on the focusing area to obtain a second image, according to a preset zoom-in ratio. The second image includes an enlarged focusing area, and an SNR of the second image is greater than the SNR of the focusing area.

In some embodiments, the second image can include a plurality of original pixels and a plurality of interpolated pixels. The original pixels refer to the pixels of the focusing area.

The focus process device 820 can be configured to, according to a position of a first interpolated pixel of the plurality of interpolated pixels in the second image, determine N reference original pixels in the focusing area that correspond to the first interpolated pixel, where N≥1, and according to the preset zoom-in ratio and the grayscale values of the N reference original pixels, determine a grayscale value of the first interpolated pixel.

In some embodiments, the focus process device 820 can be configured to determine the first reference original pixel in the focusing area, according to the preset zoom-in ratio and the position of the first interpolated pixel in the second image. The position of the first reference original pixel in the focusing area corresponds to the position of the first interpolated pixel in the second image. The focus process device 820 can be further configured to determine N−1 second reference original pixels in the focusing area, according to the first reference original pixel. The positional relationship between the N−1 second reference original pixels and the first reference original pixel can satisfy a preset position condition.

In some embodiments, the focusing area includes two-dimensionally arranged X×Y pixels, where X and Y are integers and X≥1 and Y≥1.

The focus process device 820 can be configured to, when the preset zoom-in ratio is 1:M (M being a positive number) and the coordinate position of the first interpolated pixel in the second image is (M×i+1, M×j+1), determine that the first reference original pixel is the pixel at the coordinate position (i, j) in the focusing area, where i∈[0, X−1], j∈[0, Y−1].

In some embodiments, X≥4, Y≥4, and the N−1 second reference original pixels include pixels in the focusing area at the following position coordinates:

(i−1,j−1),(i,j−1),(i+1,j−1),(i+2,j−1)

(i−1,j),(i,j),(i+1,j),(i+2,j)

(i−1,j+1),(i,j+1),(i+1,j+1),(i+2,j+1)

(i−1,j+2),(i,j+2),(i+1,j+2),(i+2,j+2)

In some embodiments, the focus apparatus also includes an image display device configured to display the first image and the second image.

In some embodiments, the focus process device 820 can also be configured to perform a second digital zoom process according to a preset zoom-out ratio, such that the currently used digital zoom factor can be changed from the second digital zoom factor to the first digital zoom factor. The preset zoom-out ratio corresponds to the preset zoom-in ratio. The first digital zoom factor is the digital zoom factor before the first digital zoom process, and the second digital zoom factor is the digital zoom factor after the first digital zoom process.

In some embodiments, the first image is the image captured using the first focus distance. The focus distance obtained after the focus process is the second focus distance.

The image acquisition device 810 can also be configured to capture a third image using the first digital zoom factor and the second focus distance.

The image display device can also be configured to display the third image.

Each device of the focus apparatus 800 and the operations and/or functions described above can respectively implement the corresponding processes in the method 400 shown in FIG. 4 and detailed description is omitted here.

According to the disclosure, the focus apparatus can perform the first digital zoom process on the focusing area to zoom-in the focusing area, such that the SNR of the enlarged focusing area can be increased, the evaluation-value change curve can be smoothed, which facilitates a peak search of the evaluation-value change curve, speeds up the peak search, and increases an accuracy of the peak search, thereby improving the focus speed and the focus accuracy.

Figure 14:
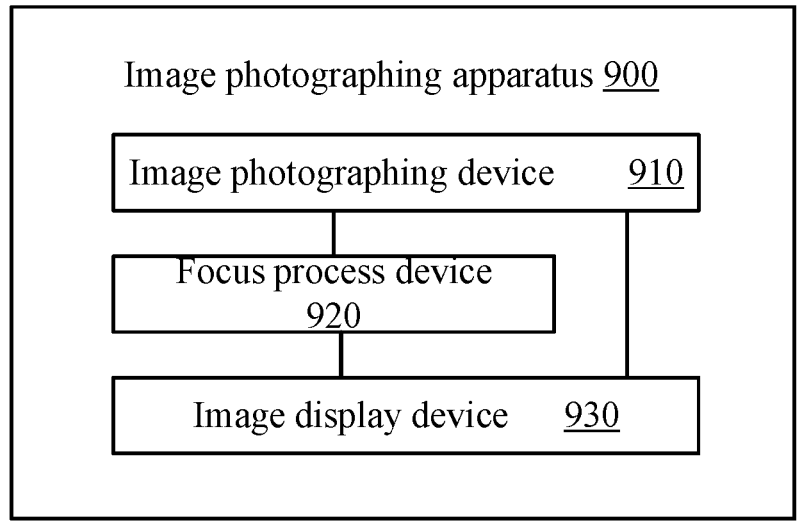
FIG. 14 is a schematic structural diagram of an image photographing apparatus according to an example embodiment.

FIG. 14 is a schematic structural diagram of an image photographing apparatus 900 consistent with the disclosure. As shown in FIG. 14, the image photographing apparatus 900 includes an image photographing device 910, a focus process device 920, and an image display device 930.

The image photographing device 910 is configured to capture a first image using a first digital zoom factor and a first focus distance and capture a third image using the first digital zoom factor and a second focus distance determined by the focus process device 920.

The focus process device 920 is configured to determine a focusing area in the first image. The focusing area includes at least one pixel and the focusing area includes some pixels of the first image. The focus process device 920 is also configured to perform a first digital zoom process on the focusing area using a preset zoom-in ratio to obtain a second image. The second image includes an enlarged focusing area, and an SNR of the second image is greater than the SNR of the focusing area. The digital zoom factor obtained after a digital zoom process and used by the image photographing device 910 is a second digital zoom factor. The focus process device 920 is further configured to perform a focus process to determine a second focus distance based on the second image and perform a second digital zoom process, according to a preset zoom-out ratio, such that a currently used digital zoom factor is changed from the second digital zoom factor to the first digital zoom factor. The preset zoom-out ratio corresponds to the preset zoom-in ratio.

The image display device 930 is configured to display the first image, the second image, and the third image.

In some embodiments, the second image can include a plurality of original pixels and a plurality of interpolated pixels. The original pixels refer to the pixels of the focusing area.

The focus process device 920 can be configured to, according to a position of a first interpolated pixel of the plurality of interpolated pixels in the second image, determine N reference original pixels in the focus area that correspond to the first interpolated pixel, where N≥1, and according to the preset zoom-in ratio and the grayscale values of the N reference original pixels, to determine a grayscale value of the first interpolated pixel.

In some embodiments, the focus process device 920 can be configured to determine the first reference original pixel in the focusing area, according to the preset zoom-in ratio and the position of the first interpolated pixel in the second image. The position of the first reference original pixel in the focusing area corresponds to the position of the first interpolated pixel in the second image. The focus process device 920 can be further configured to determine N−1 second reference original pixels in the focusing area, according to the first reference original pixel. The positional relationship between the N−1 second reference original pixels and the first reference original pixel can satisfy a preset position condition.

In some embodiments, the focusing area includes two-dimensionally arranged X×Y pixels, where X≥1 and Y≥1.

The focus process device 920 can be configured, when the preset zoom-in ratio is 1:M and the coordinate position of the first interpolated pixel in the second image is (M×i+1, M×j+1), to determine that the first reference original pixel is the pixel at the coordinate position (i, j) in the focusing area, where i∈[0, X−1], j∈[0, Y−1].

In some embodiments, X≥4, Y≥4, and the N−1 second reference original pixels include pixels in the focusing area at the following position coordinates:

$$(i-1,j-1),(i,j-1),(i+1,j-1),(i+2,j-1)$$

$$(i-1,j),(i,j),(i+1,j),(i+2,j)$$

$$(i-1,j+1),(i,j+1),(i+1,j+1),(i+2,j+1)$$

$$(i-1,j+2),(i,j+2),(i+1,j+2),(i+2,j+2)$$

Each device of the image photographing apparatus 900 and the operations and/or functions described above can respectively implement the corresponding processes in the method 500 shown in FIG. 5 and detailed description is omitted here.

According to the disclosure, the image photographing apparatus can perform the first digital zoom process on the focusing area to zoom-in the focusing area, such that the SNR of the enlarged focusing area can be increased, the evaluation-value change curve can be smoothed, which facilitates a peak search of the evaluation-value change curve, speeds up the peak search, and increases an accuracy of the peak search, thereby improving the focus speed and the focus accuracy.

Figure 15:
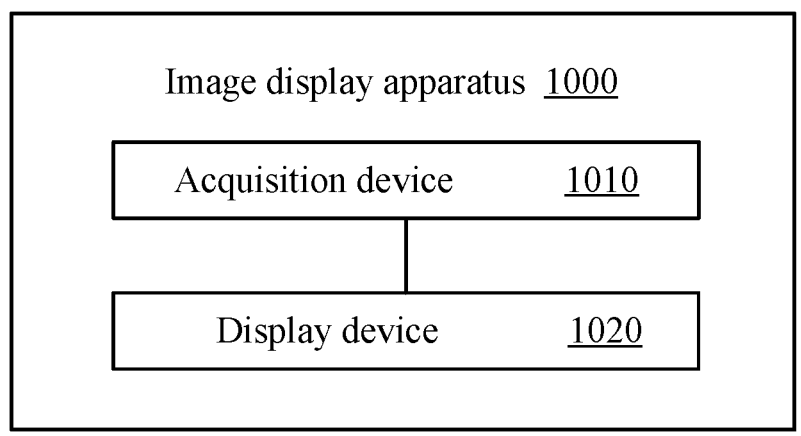
FIG. 15 is a schematic structural diagram of an image display apparatus according to an example embodiment.

FIG. 15 is a schematic structural diagram of an image display apparatus 1000 consistent with the disclosure. As shown in FIG. 15, the image display apparatus 1000 includes an acquisition device 1010 and a display device 1020.

The acquisition device 1010 is configured to obtain a first image from an image photographing apparatus communicatively connected to the image display apparatus 1000 in a first time period, obtain a second image from the image photographing apparatus communicatively connected to the image display apparatus 1000 in a second time period, and obtain a third image from the image photographing apparatus communicatively connected to the image display apparatus 1000 in a third time period. The first image is an image captured using a first digital zoom factor and a first focus distance. The second image is an image obtained by performing a first digital zoom process on a focusing area in the first image using a preset zoom-in ratio. The focusing area includes at least one pixel. The second image includes an enlarged focusing area, and an SNR of the second image is greater than the SNR of the focusing area. The third image is an image captured using the first digital zoom factor and a second focus distance. The second focus distance is a focus distance determined by a focus process using the second image.

The display device 1020 is configured to display the first image in the first time period, display the second image in the second time period, and display the third image in the third time period.

In some embodiments, the second image can include a plurality of original pixels and a plurality of interpolated pixels. The original pixels refer to the pixels of the focusing area.

According to a position of a first interpolated pixel of the plurality of interpolated pixels in the second image, N reference original pixels in the focus area that correspond to the first interpolated pixel can be determined, where N≥1, and according to the preset zoom-in ratio and the grayscale values of the N reference original pixels, a grayscale value of the first interpolated pixel can be determined.

In some embodiments, the first reference original pixel can be determined in the focusing area, according to the preset zoom-in ratio and the position of the first interpolated pixel in the second image. The position of the first reference original pixel in the focusing area corresponds to the position of the first interpolated pixel in the second image. N−1 second reference original pixels in the focusing area can be determined, according to the first reference original pixel. The positional relationship between the N−1 second reference original pixels and the first reference original pixel can satisfy a preset position condition.

In some embodiments, the focusing area includes two-dimensionally arranged X×Y pixels, where X≥1 and Y≥1.

When the preset zoom-in ratio is 1:M and the coordinate position of the first interpolated pixel in the second image is (M×i+1, M×j+1), the first reference original pixel can be the pixel at the coordinate position (i, j) in the focusing area, where i∈[0, X−1], j∈[0, Y−1].

In some embodiments, X≥4, Y≥4, and the N−1 second reference original pixels include pixels in the focusing area at the following position coordinates:

$$(i-1,j-1),(i,j-1),(i+1,j-1),(i+2,j-1)$$

$$(i-1,j),(i,j),(i+1,j),(i+2,j)$$

$$(i-1,j+1),(i,j+1),(i+1,j+1),(i+2,j+1)$$

$$(i-1,j+2),(i,j+2),(i+1,j+2),(i+2,j+2)$$

In some embodiments, the image photographing apparatus can be arranged at a first device, the image display apparatus can be arranged at a second device, and the first device and the second device can perform wired communication or wireless communication.

In some embodiments, the first device can be a UAV and the second device can be a terminal device or a remote controller.

The focus method and apparatus, the image photographing method and apparatus, the image display method and apparatus, and the photographing system consistent with the disclosure can be implemented by a computer. The computer can include a hardware layer, an operating system layer running on the hardware layer, and an application layer running on the operating system layer. The hardware layer can include hardware, such as a Central Processing Unit (CPU), a Memory Management Unit (MMU), a memory (also referred to as a main memory), or the like. The operating system can be any one or more computer operating systems that implement business processing through a process, for example, a Linux operating system, a Unix operating system, an Android operating system, an iOS operating system, a windows operating system, or the like. The application layer can include applications, such as a browser, an address book, a word processing software, an instant messaging software, or the like. In addition, the computer can be a handheld device, such as a smart phone or the like, or can be a terminal device, such as a personal computer or the like, which is not limited in the present disclosure, as long as the computer can run a program including the code of the focus method and the image photographing method consistent with the disclosure.

Furthermore, various aspects or features of the disclosure can be implemented as a method, an apparatus, or an article of manufacture using a standard programming and/or an engineering technique. The term "article of manufacture" used herein encompasses a computer program accessible from any computer-readable device, carrier, or media. For example, the computer readable medium can include, but is not limited to, a magnetic storage device, e.g., a hard disk, a floppy disk, a magnetic tape, or the like, an optical disk, e.g., a Compact Disc (CD), a Digital Versatile Disc (DVD), or the like, a smart card and flash memory device, e.g., an Erasable Programmable Read-Only Memory (EPROM) and an erasable programmable read-only memory, a card, a stick, a key driver, or the like. In addition, various storage media described herein may represent one or more devices and/or other machine-readable media for storing information. The term "machine-readable medium" can include, but is not limited to, a wireless channel and various other mediums capable of storing, containing, and/or carrying instructions and/or data.

The term "one embodiment" or "an embodiment" used in the specification means that a particular feature, structure, or characteristic described in connection with the embodiment is included in at least one embodiment of the present disclosure. Therefore, the term "in one embodiment" or "in an embodiment" in the specification does not refer to a same embodiment. In the situation of no conflict, the embodiments and features of the embodiments can be combined.

The sequence numbers of the processes in the above-described embodiments do not mean the order of execution, which is not intended to limit the implementation process of the embodiments of the present disclosure, and the order of execution of each process should be determined by the function and internal logic.

It should be appreciated that "B corresponding to A" means that B is associated with A, and B can be determined according to A in the present disclosure. It should also be appreciated that determining B from A does not mean that B is only determined from A, and B can also be determined from A and/or other information.

It should be understood that the term "and/or" in the specification merely represents an associated relationship that describes the associated objects and means that there can be three relationships. For example, A and/or B can indicate three situations that are only A, A and B, and only B. In addition, the character "/" in the specification generally indicates that the associated objects are an "or" relationship.

Those of ordinary skill in the art will appreciate that the example elements and algorithm steps described above can be implemented in electronic hardware, or in a combination of computer software and electronic hardware. Whether these functions are implemented in hardware or software depends on the specific application and design constraints of the technical solution. One of ordinary skill in the art can use different methods to implement the described functions for different application scenarios, but such implementations should not be considered as beyond the scope of the present disclosure.

For simplification purposes, detailed descriptions of the operations of example systems, devices, and units may be omitted and references can be made to the descriptions of the example methods.

The disclosed systems, apparatuses, and methods may be implemented in other manners not described here. For example, the devices described above are merely illustrative. For example, the division of units may only be a logical function division, and there may be other ways of dividing the units. For example, multiple units or components may be combined or may be integrated into another system, or some features may be ignored, or not executed. Further, the coupling or direct coupling or communication connection shown or discussed may include a direct connection or an indirect connection or communication connection through one or more interfaces, devices, or units, which may be electrical, mechanical, or in other form.

The units described as separate components may or may not be physically separate, and a component shown as a unit may or may not be a physical unit. That is, the units may be located in one place or may be distributed over a plurality of network elements. Some or all of the components may be selected according to the actual needs to achieve the object of the present disclosure.

In addition, the functional units in the various embodiments of the present disclosure may be integrated in one processing unit, or each unit may be an individual physically unit, or two or more units may be integrated in one unit.

A method consistent with the disclosure can be implemented in the form of computer program stored in a non-transitory computer-readable storage medium, which can be sold or used as a standalone product. The computer program can include instructions that enable a computer device, such as a personal computer, a server, or a network device, to perform part or all of a method consistent with the disclosure, such as one of the example methods described above. The storage medium can be any medium that can store program codes, for example, a USB disk, a mobile hard disk, a read-only memory (ROM), a random access memory (RAM), a magnetic disk, or an optical disk.

Other embodiments of the disclosure will be apparent to those skilled in the art from consideration of the specification and practice of the embodiments disclosed herein. It is intended that the specification and examples be considered as example only and not to limit the scope of the disclosure, with a true scope and spirit of the invention being indicated by the following claims.

What is claimed is:

1. A focusing method comprising:
   obtaining, by a processor, a first image;
   determining, by the processor, a focusing area from the first image, the focusing area comprising at least one pixel;
   performing, by the processor, a digital zoom process on the focusing area according to a zoom-in ratio to obtain a second image comprising a plurality of original pixels from the focusing area and an interpolated pixel, performing the digital zoom process comprising:
   determining N reference original pixels from the plurality of original pixels according to the zoom-in ratio and a position of the interpolated pixel in the second image, a position of one of the N reference original pixels in the focusing area corresponding to the position of the interpolated pixel in the second image, and N being an integer equal to or larger than 1; and performing, by the processor, a focus process on the second image according to the interpolated pixel and the N reference original pixels.

2. The method of claim 1, wherein:
performing the digital zoom process on the focusing area further comprises:
determining a grayscale value of the interpolated pixel according to the zoom-in ratio and grayscale values of the N reference original pixels.

3. The method of claim 1, wherein determining the N reference original pixels comprises:
determining a first reference original pixel from the focusing area according to the zoom-in ratio and the position of the interpolated pixel in the second image, a position of the first reference original pixel in the focusing area corresponding to the position of the interpolated pixel in the second image; and
determining N-1 second reference original pixels from the focusing area according to the first reference original pixel, a positional relationship between the N-1 second reference original pixels and the first reference original pixel satisfying a preset position condition.

4. The method of claim 3, wherein:
the plurality of original pixels are arranged in an X×Y array, X being an integer equal to or larger than 1, and Y being an integer equal to or larger than 1;
the zoom-in ratio is 1:M, M being a positive number;
the position of the interpolated pixel in the second image is (M×i+1, M×j +1), i and j being integers and i ∈[0, X−1], j ∈[0, Y−1]; and
determining the first reference original pixel comprises determining the first reference original pixel to be one of the plurality of original pixels at a position (i, j) in the focusing area.

5. The method of claim 4, wherein:
X is equal to or larger than 4 and Y is equal to or larger than 4; and
the N-1 second reference original pixels comprise pixels in the focusing area at following positions:

(i−1, j−1), (i, j−1), (i+1, j−1), (i+2, j−1)

(i−1, j), (i, j), (i+1, j), (i+2, j)

(i−1, j+1), (i, j+1), (i+1, j+1), (i+2, j+1)

(i−1, j+2), (i, j+2), (i+1, j+2), (i+2, j+2).

6. The method of claim 1, further comprising:
displaying the first image; and
displaying the second image.

7. The method of claim 1,
wherein:
the digital zoom process is a first digital zoom process;
a first digital zoom factor is used for acquiring the first image; and
a second digital zoom factor is used for acquiring the second image;
the method further comprising:
performing a second digital zoom process according to a zoom-out ratio to change a currently-used digital zoom factor from the second digital zoom factor to the first digital zoom factor.

8. The method of claim 7,
wherein a first focus distance is used for acquiring the first image and a second focus distance is used for acquiring the second image;
the method further comprising:
obtaining a third image according to the first digital zoom factor and the second focus distance; and
displaying the third image.

9. The method of claim 1, wherein the second image comprises the focusing area after being enlarged according to the digital zoom process.

10. The method of claim 1, wherein a signal-to-noise ratio (SNR) of the second image is greater than an SNR of the focusing area.

11. A focusing apparatus comprising:
a processor; and
a storage medium storing a computer program that, when executed by the processor, causes the processor to:
obtain a first image;
determine a focusing area from the first image, the focusing area comprising at least one pixel;
perform a digital zoom process on the focusing area according to a zoom-in ratio to obtain a second image comprising a plurality of original pixels from the focusing area and an interpolated pixel, performing the digital zoom process comprising:
determining N reference original pixels from the plurality of original pixels according to the zoom-in ratio and a position of the interpolated pixel in the second image, a position of one of the N reference original pixels in the focusing area corresponding to the position of the interpolated pixel in the second image, and N being an integer equal to or larger than 1; and
perform a focus process on the second image according to the interpolated pixel and the N reference original pixels.

12. The apparatus of claim 11, wherein:
the computer program further causes the processor to:
determine a grayscale value of the interpolated pixel according to the zoom-in ratio and grayscale values of the N reference original pixels.

13. The apparatus of claim 11, wherein the computer program further causes the processor to:
determine a first reference original pixel from the focusing area according to the zoom-in ratio and the position of the interpolated pixel in the second image, a position of the first reference original pixel in the focusing area corresponding to the position of the interpolated pixel in the second image; and
determine N-1 second reference original pixels from the focusing area according to the first reference original pixel, a positional relationship between the N-1 second reference original pixels and the first reference original pixel satisfying a preset position condition.

14. The apparatus of claim 13, wherein:
the plurality of original pixels are arranged in an X×Y array, X being an integer equal to or larger than 1, and Y being an integer equal to or larger than 1;
the zoom-in ratio is 1:M, M being a positive number;
the position of the interpolated pixel in the second image is (M×i+1, M×j +1), i and j being integers and i ∈[0, X−1], j ∈[0, Y−1]; and
the computer program further causes the processor to determine the first reference original pixel to be one of the plurality of original pixels at a position (i, j) in the focusing area.

15. The apparatus of claim 14, wherein:

X is equal to or larger than 4 and Y is equal to or larger than 4; and the N-1 second reference original pixels comprise pixels in the focusing area at following positions:

$(i-1, j-1), (i, j-1), (i+1, j-1), (i+2, j-1)$ $(i-1, j), (i, j), (i+1, j), (i+2, j)$ $(i-1, j+1), (i, j+1), (i+1, j+1), (i+2, j+1)$ $(i-1, j+2), (i, j+2), (i+1, j+2), (i+2, j+2)$.

16. The apparatus of claim 11, further comprising:

a display configured to display the first image and the second image.

17. The apparatus of claim 11, wherein:

the digital zoom process is a first digital zoom process;

a first digital zoom factor is used for acquiring the first image;

a second digital zoom factor is used for acquiring the second image; and the computer program further causes the processor to perform a second digital zoom process according to a zoom-out ratio to change a currently-used digital zoom factor from the second digital zoom factor to the first digital zoom factor.

18. The apparatus of claim 17, wherein:

a first focus distance is used for acquiring the first image and a second focus distance is used for acquiring the second image; and the computer program further causes the processor to obtain a third image according to the first digital zoom factor and the second focus distance;

the apparatus further comprising:

a display configured to display the third image.

19. The apparatus of claim 11, wherein the second image comprises the focusing area after being enlarged according to the digital zoom process.

20. The apparatus of claim 11, wherein a signal-to-noise ratio (SNR) of the second image is greater than an SNR of the focusing area.

* * * * *